Figure 2:
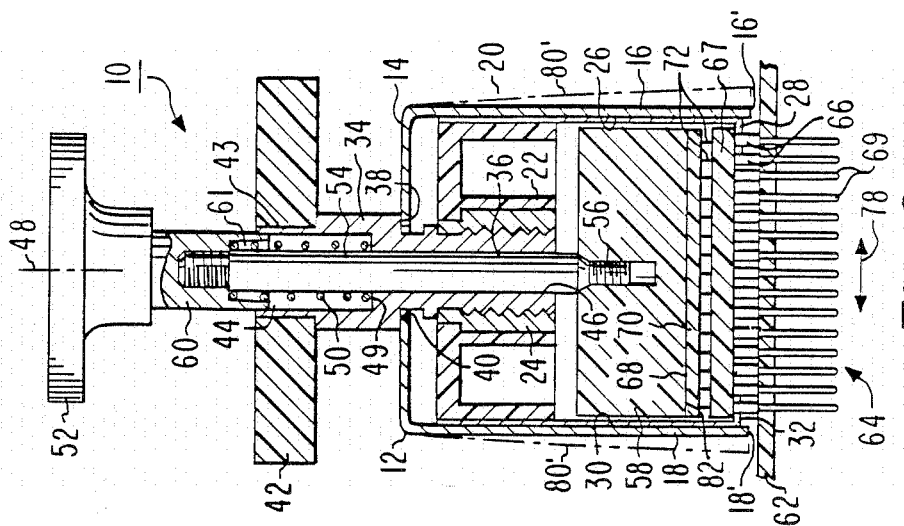

United States Patent [19]

Guyer

[11] Patent Number: 4,800,647

[45] Date of Patent: Jan. 31, 1989

[54] ELECTRIC MODULE INSERTION TOOL

[75] Inventor: Anthony W. Guyer, Bensalem, Pa.

[73] Assignee: General Electric Company, Schenectady, N.Y.

[21] Appl. No.: 96,081

[22] Filed: Sep. 14, 1987

[51] Int. Cl.$^4$ .................. H05K 3/30; H05K 13/04
[52] U.S. Cl. .................. 29/741; 29/758; 29/764
[58] Field of Search .................. 29/741, 739, 758, 764

[56] References Cited

U.S. PATENT DOCUMENTS

| | | | |
|---|---|---|---|
| 2,954,809 | 10/1960 | Loewy | 145/52 |
| 3,632,973 | 1/1972 | O'Keefe | 219/230 |
| 4,276,789 | 7/1981 | Allen | 81/3.36 |
| 4,539,874 | 9/1985 | Jacovitz | 81/454 |
| 4,597,174 | 7/1986 | Sevigny | 29/741 |
| 4,615,110 | 10/1986 | Crone | 29/741 |

OTHER PUBLICATIONS

A. G. Zak, "Module Attach and Removal Tool," *IBM Technical Disclosure Bulletin,* vol. 14, No. 4, (Sep. 1971).
"Operating Instruction EZ-I/O TM Pin Grid Insertion and Extraction Tool," (Massachusetts: AUGAT Inc., Mar. 1985), S-3772.

*Primary Examiner*—Carl E. Hall
*Attorney, Agent, or Firm*—William Squire; James C. Davis, Jr.; Paul R. Webb, II

[57] ABSTRACT

A Pin Grid Array (PGA) insertion tool includes first and second sets of moveably mounted facing fingers which are inserted in the space between a PGA connector and the substrate to which the connector is secured. A plunger includes a PGA insertion member slideably secured to the fingers. The fingers force the insertion member to align parallel to the plane of the connector to preclude tilting of the PGA during insertion. A guide shaft secured to the fingers guides the insertion member during insertion.

4 Claims, 1 Drawing Sheet

ELECTRIC MODULE INSERTION TOOL

This invention relates to a tool for inserting pin grid arrays into mating connector sockets secured to a substrate.

Pin grid arrays (PGA) are devices which have a large array of terminals commonly referred to as pins, for example, 15×15, 15×12, or larger. The PGA pins are slideably secured into mating sockets of a connector secured to a substrate, for example, a printed circuit board. The connector sockets may be solder terminals or wire wrap terminals which pass through mating apertures in the substrate. The socket terminals are soldered to mating conductors on the substrate.

Because of the large number of pins on the PGA and the relatively large area encompassed by the array of pins, for example, approximately four centimeters on a side, a relatively large insertion and retraction force is required to insert and retract the PGA from the connector. In addition, because of the relatively large dimensions of the PGA, the PGA tends to tilt and cock when withdrawn from or inserted into the socket which tilting tends to bind the pins in the sockets further increasing the insertion and withdrawal forces as well as possibly damaging the pins.

Because of these relatively high insertion and retraction forces, tools have been provided for insertion and retraction of the PGA from its socket. One such tool has a first mode for extracting a PGA from its socket and a second mode for inserting the PGA into its socket. The extraction tool works well, but a problem is present with the insertion portion of the tool, the same tool being intended to perform both functions. During insertion, a pair of tool support legs are spaced from the PGA being inserted. The PGA rests on the connector into which it is to be inserted. The tool includes an insertion plunger which manually engages the PGA to provide a manual insertion force on the PGA. The support legs rest on the printed circuit board for supporting the tool during insertion. These legs tend to slide on and abrade the circuit board or substrate surface during insertion because during manual insertion the tool is not restrained from lateral displacement. Such lateral displacement also may contribute to misalignment of the tool and thus may contribute to tilting the PGA during insertion. The present invention is an improvement over the insertion portion of that tool.

According to the present invention a tool is provided for inserting the leads of an electronic module into sockets of a mating connector secured to a substrate. The tool comprises connector grasping means adapted for releasably grasping the connector at a surface thereof intermediate the connector and substrate. The grasping means are adapted to align relative to the grasped connector. Plunger means are movably secured to and aligned by the grasping means and have a surface adapted to abut the module at a module surface opposite the module leads for displacing the module leads in a direction toward the connector and substrate determined by the grasping means. Means are secured to the plunger means and are adapted to receive a pushing force for pushing the plunger means against the module and toward the grasped connector for manually inserting the leads into the sockets. The grasping means include bearing means arranged to guide and align the plunger means during the pushing to insert the leads in the direction substantially uniformly into the socket.

IN THE DRAWING

Figure 1:
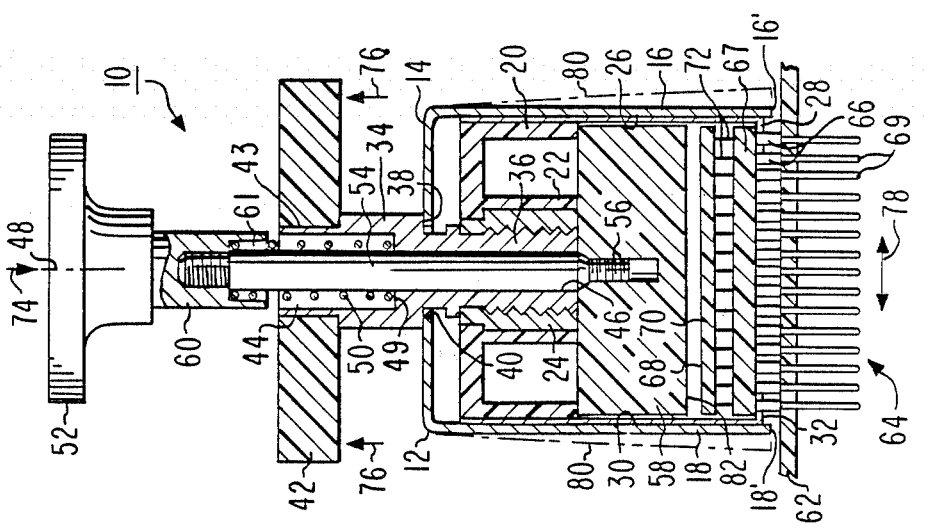

FIG. 1 is a sectional elevation view through a tool according to one embodiment of the present invention in a position to manually insert a PGA into its mating socket secured to a substrate; and FIG. 2 is a sectional elevation view of the tool of FIG. 1 illustrating the tool in a second position after insertion of the PGA into its mating connector.

In FIG. 1 tool 10 includes a U-shaped member 12, which may be sheet metal, having a planar base wall 14 and two parallel planar legs 16 and 18 whose planes are normal to the drawing. Legs 16 and 18 have respective edges 16' and 18' parallel to wall 14.

A rectangular support block 20 which may be molded of thermoplastic material has a hollow circular cylindrical central boss 22. A metal threaded insert 24 is secured in the cavity of boss 22. A sheet metal extension 26 is secured to block 20 between leg 16 and the block. An array of comb-like fingers 28 extend from the lower most end of extension 26 adjacent edge 16' of leg 16. Fingers 28 extend inwardly toward leg 18. An identical extension 30 is secured between leg 18 and block 20 on the side of block 20 opposite leg 16. Extension 30 includes an identical set of comb-like fingers 32. Fingers 28 and 32 are aligned with and face one another.

Plug member 34 is attached to insert 24 via member 34 threaded shaft 36 engaged with the threads of insert 24. Member 34 has an annular shoulder 38 which abuts the facing surface of base wall 14. Shaft 36 is located in aperture 40 in wall 14.

A circular disc like member 42 which may be molded thermoplastic material is press fitted to shaft portion 43 of member 34. Member 42 is sufficient large to be grasped by a hand of a person in which the fingers may slip in the space between member 42 and wall 14. Member 34 includes a circular cylindrical cavity 44 and a small diameter centrally located cylindrical opening 46. Opening 46 and cavity 44 are concentric on longitudinal axis 48.

A compression spring 50 is in cavity 44 and abuts shoulder 49 of member 34 at the base of cavity 44. A knob 52 is secured to circular cylindrical shaft 54 which is slideably engaged with member 34 in opening 46. Shaft 54 has threads 56 which are engaged with mating threads in insertion block 58. Block 58 may be made out of hard plastic materials such as Teflon ® or other materials that are commercially available which are essentially noncompressable but are such to preclude damaging the PGA during insertion. Knob 52 in the region adjacent to shaft 54 includes a reduced diameter portion 60 in which is a circular cylindrical cavity 61 which receives an end of a spring 50.

A PGA connector 64 is attached to substrate 62 such as a printed circuit board or other structure. Connector 64 includes an array of sockets 66 secured to the connector body 67. The sockets 66 are electrically connected to terminals 69 and are arranged in a rectangular or square array as known in this art for receiving the pins of a conventional PGA.

PGA 68 includes a substrate 70 and an array of connector pins 72. The spacing of pins 72 is identical to the spacing of sockets 66 and are arranged for insertion into the cavities of sockets 66. The simultaneous insertion of all pins into the sockets has a relatively high insertion force.

In operation of the tool 10, FIG. 1, the palm or thumb of a user engages knob 52 and applies a force in the direction of arrow 74. Other fingers of the user engage member 42 and apply a force on member 42 in the direction of arrows 76 opposite arrow 74. PGA 68, in the meantime, has been placed with its pins 72 resting in the openings of the sockets 66. The tool fingers 28 and 32 are spread apart manually in directions 78 as shown in phantom at 80. The fingers 28 and 32 are then released and their resiliency inserts them in the space between the connector 64 body and the substrate 62. The fingers 28 and 32 are spaced from one another in each array so that the sockets 66 are located between the spaces of adjacent fingers in comb-like fashion. The fingers 28 and 32 are bent at right angles to legs 16 and 18 and lock against the surface of the connector 64 body 67 in the region between the body and substrate 62.

Insertion block 58 planar lower surface 82 engages the upper surface of PGA 68 and abuts the PGA uniformly. With the fingers 28 and 32 engaged, the knob 52 is pushed in direction of arrow 74 while the fingers of an operator assert a force on member 42 in the direction of arrows 76. The force on member 42 causes the fingers 28 and 32 to grasp the connector body 67 and align the tool 10 axis 48 perpendicular to the plane of the connector 64 and substrate 62. While maintaining the force in the direction of arrows 76, the knob 42 is pushed in direction 74. This inserts the PGA uniformly in direction of arrow 74. The force on the fingers 28 and 32 against the connector 64 body maintains alignment of the tool 10 during insertion of the PGA. This precludes cocking of the PGA during the insertion. Further, legs 16 and 18 and extension 26 and 30 do not contact the substrate 62, precluding damage to the substrate. Plug member 34 guides knob 52 and insertion block 58 during insertion via the sliding bearing action of shaft 54 and opening 46. Because plug member 34 is secured to member 12 at base wall 14, the relative alignment of shaft 54 and insertion member 58 to connector grasping fingers 28 and 32 is assured.

FIG. 2 illustrates the relative position of the insertion of block 58 to the PGA after insertion of the PGA pins into its mating sockets of the connector 64. When the PGA is fully inserted, the fingers 28 and 32 are manually spread apart as shown by the phantom lines 80'. In the alternative, the extensions supporting these fingers can be hinged to permit such action. The spreading apart action disengages the fingers from the connector body and the tool is released. Spring 50 is compressed during insertion and returns the knob 52 to its initial starting position relative to member 12 when the inserting forces are released.

What is claimed is:

1. A tool for inserting the leads of an electronic module into sockets of a mating connector secured to a substrate, said connector sockets having a given spacing and including terminal portions having said spacing and attached to said substrate, said tool comprising:
    connector grasping means for releasably grasping said connector at a surface thereof intermediate the connector and substrate, said grasping means being constructed so as to align relative to the grasped connector;
    plunger means moveably secured to and aligned by said grasping means and having a surface for abutting said module at a module surface opposite said module leads and for displacing the module leads in a direction toward said connector and substrate determined by said grasping means; and
    means secured to said plunger means for receiving a pushing force for pushing said plunger means against said module and toward said grasped connector to manually insert said leads into said sockets, said connector grasping means including bearing means arranged to guide and align the plunger means during said pushing to insert said leads in said direction substantially uniformly into said sockets,
    said connector grasping means including first and second arrays of spaced facing connector grasping fingers arranged to be inserted in the interstices of said terminals in the region between said connector and substrate for aligning the grasping means to the connector.

2. The tool of claim 1 wherein said grasping means includes means arranged for orientating said plunger means so it can displace substantially normal to said plunger surface.

3. The tool of claim 1 wherein said connector grasping means includes a U-shaped member having a base wall and first and second legs extending from the base wall and a set of comb-like fingers cantilevered from each said legs, each set extending toward the other set.

4. The tool of claim 3 wherein said plunger means includes a shaft slideably secured to the base wall and a module engaging member between the legs secured to one end of said shaft, said means adapted to receive a pushing force being secured to the other end of said shaft.

* * * * *